United States Patent
Corcoran et al.

(10) Patent No.: US 6,586,283 B2
(45) Date of Patent: *Jul. 1, 2003

(54) APPARATUS AND METHOD FOR PROTECTING INTEGRATED CIRCUIT CHARGE STORAGE ELEMENTS FROM PHOTO-INDUCED CURRENTS

(75) Inventors: John J. Corcoran, Portola Valley, CA (US); Travis N. Blalock, Charlottesville, VA (US); Paul J. Vande Voorde, San Mateo, CA (US); Thomas A. Knotts, Palo Alto, CA (US); Neela B. Gaddis, Saratoga, CA (US)

(73) Assignee: Agilent Technologies, Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/539,490
(22) Filed: Mar. 30, 2000

(65) Prior Publication Data
US 2003/0075770 A1 Apr. 24, 2003

(51) Int. Cl.[7] .................. H01L 31/332; H01L 21/76
(52) U.S. Cl. ............. 438/140; 438/48; 438/570; 438/454
(58) Field of Search ................ 438/414, 415, 438/454, 570, 48, 69–70, 140; 257/488, 490–491, 493–496, 409, 452, 484, 127, 170, 339, 372–376, 394–400, 605, 290–294, 435, 107–108

(56) References Cited

U.S. PATENT DOCUMENTS

| | | | | |
|---|---|---|---|---|
| 4,430,672 A | * | 2/1984 | Berger | 358/213 |
| 5,491,358 A | * | 2/1996 | Miyata | |
| 6,078,085 A | * | 6/2000 | Suzuki | 257/369 |
| 6,218,692 B1 | * | 4/2001 | Guidash et al. | |

\* cited by examiner

Primary Examiner—Long Pham
Assistant Examiner—DiLinh Nguyen

(57) ABSTRACT

An apparatus and a method for protecting charge storage elements from photo-induced currents in silicon integrated circuits are provided. In order to protect against photo-induced currents that are generated outside the storage node circuits themselves, an n-well guard ring is placed as closely as possible to the transistors and other elements in the storage node circuits. As a result there is a minimum of exposed silicon area in which light can produce current in areas next to the storage node circuits, and the n-well guard ring captures photo-induced currents that are generated outside the storage node circuits. In order to protect against the photo-induced currents that are generated inside the storage node circuits, an aluminum interconnect layer is placed on top of the storage node circuit, separated by an insulating layer of silicon dioxide. This creates a shield against the light and protects the storage node circuit by reflecting light away.

6 Claims, 2 Drawing Sheets

APPARATUS AND METHOD FOR PROTECTING INTEGRATED CIRCUIT CHARGE STORAGE ELEMENTS FROM PHOTO-INDUCED CURRENTS

TECHNICAL FIELD

The present invention relates generally to integrated circuits exposed to light and more generally to protecting such integrated circuits from damaging photo-induced currents.

BACKGROUND

Integrated Circuits (ICs) are widely used in industry. Among the applications are as analog elements that use analog charge storage elements, and as digital elements such as dynamic random access memories (DRAMs) that use analog charges stored on capacitors to represent binary digits. Because the storage of charge represents valuable data, it is important in all such applications to precisely preserve the value of the charge that has been stored so the data is stored in an uncorrupted state. The data will become corrupted if the charge is changed in any way. Therefore, the IC must be protected from anything that might corrupt the data, such as leakage currents, or in this case, currents induced by light falling on the IC.

Silicon, the main material used in constructing ICs, is a good visible light photocurrent producer. When light around the visible and infrared spectra, about 4,000 Å to 8,000 Å, falls on the IC, the energy of the light can produce free electrons, or a "photo-induced current", in the silicon.

In some applications, ICs are used to form an image and they are intentionally exposed to light. Such ICs take advantage of photo-induced currents and are designed to convert light into electrons of measurable current in order to convert the visual image into electronic data.

While beneficial in some parts of the chip, the photo-induced currents can be damaging in others.

There are many specific applications where light threatens the integrity of stored data. Display devices are a prime example because the ICs are exposed to significant amounts of light. In these applications, the electrons of the photo-induced current can either bleed off the charge that is stored on a display device's storage element or add to the existing charge, in both cases corrupting the stored data, which results in deterioration in the quality of the resulting display device image.

The display devices have a metallic array of electrodes on the top surface with transistors and charge storage elements making up the IC underneath. On the top level, reflective aluminum electrodes form the display by reflecting light. In order to see the image on the display, the circuit must be illuminated with large amounts of light. The gaps between the electrodes are minimized to try to reduce the amount of light that reaches the silicon layer, but significant amounts still reach the silicon potentially leading to corrupted data. Projection applications in particular, where the intensity is extremely high, have been affected by this problem. Light leaking through gaps in the electrodes has in some cases changed the stored charge 50% from its original value. The resulting display errors can only be compensated by reducing either the contrast or the brightness of the display, which limits the range of those settings to often-undesirable levels.

Thus, a system for protecting ICs which may be detrimentally affected by photo-induced currents has been long sought but has eluded those skilled in the art.

DISCLOSURE OF THE INVENTION

The present invention provides an apparatus and a method for protecting charge storage elements from photo-induced currents in silicon integrated circuits. In order to protect against photo-induced currents that are generated outside the storage node circuits themselves, an n-well guard ring is placed as closely as possible to the transistors and other elements in the storage node circuits. This structure minimizes the exposed silicon area in which light can produce current in areas next to the storage node circuits. The n-well guard ring captures the photo-induced currents that are generated outside the storage node circuits. In order to protect against the photo-induced currents that are generated inside the storage node circuits, an aluminum interconnect layer is placed on top of the storage node circuit, separated by an insulating layer of silicon dioxide. This creates a shield against the light and protects the storage node circuit by reflecting light away.

The above and additional advantages of the present invention will become apparent to those skilled in the art from a reading of the following detailed description when taken in conjunction with the accompanying drawings.

BEST MODE FOR CARRYING OUT THE INVENTION

Recently, display devices based on electro-optical materials such as ferro-electric liquid crystal materials have been introduced. Such display devices can form part of a miniature, wearable display, sometimes called an eyeglass display, and also can form part of a front- or rear-projection display.

Figure 1:
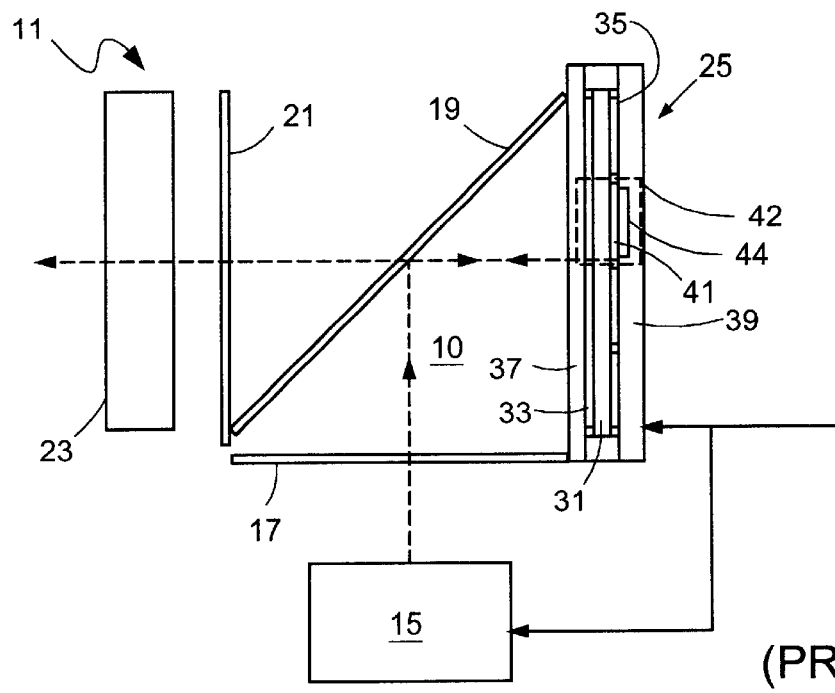
FIG. 1 (PRIOR ART) is a schematic diagram of a display device.

Referring now to FIG. 1, therein is shown a schematic diagram of an exemplary display device 11. The display device 11 is composed of a reflective light valve 10, a bright light source 15, which generates light that illuminates the light valve, and output optics 23 that focus the light to form an image (not shown). The light valve 10 is composed of a reflective spatial light modulator 25, a polarizer 17, a beam splitter 19 and an analyzer 21. The display device 11 may form part of a miniature wearable display, a projection display, or another type of display.

In the display device 11, light generated the by the bright light source 15 passes through the polarizer 17. The polarizer 17 polarizes the light output from the bright light source 15. The beam splitter 19 reflects a fraction of the polarized light output from the polarizer towards the spatial light modulator 25. The spatial light modulator 25 is divided into a two-dimensional array of picture elements (pixels) that define the pixels of the display device 11. The beam splitter 19 transmits a fraction of the light reflected by the spatial light modulator 25 to analyzer 21.

The direction of an electric field in each pixel of the spatial light modulator 25 determines whether or not the direction of polarization of the light reflected by the pixel is rotated by 90° relative to the direction of polarization of the incident light. The light reflected by each pixel of the spatial light modulator 25 passes through the beam splitter 19 and the analyzer 21 and is output from the light valve 10 depending on whether or not its direction of polarization was rotated by the spatial light modulator 25. The light output from the light valve 10 passes to the output optics 23.

The bright light source 15 may be composed of light emitting diodes (LEDs). The LEDs are of three different colors in a color display device 11. Other light-emitting devices whose output can be rapidly modulated may alternatively be used as the bright light source 15. As a further alternative, a white light source and a light modulator (not shown) may be used. The light modulator modulates the amplitude of the light generated by the white light source to define the illumination period and balance period of the spatial light modulator 25. In a light valve for use in a color display device, the light modulator additionally modulates the color of the light output from the light source.

The polarizer 17 polarizes the light generated by the light source 15. The polarization is preferably linear polarization. The beam splitter 19 reflects the polarized light output from the polarizer 17 towards spatial light modulator 25, and transmits the polarized light reflected by the spatial light modulator 25 to analyzer 21. The direction of maximum transmission of the analyzer 21 is orthogonal to that of the polarizer 17 in this example.

The spatial light modulator 25 is composed of a transparent electrode 33 deposited on the surface of a transparent cover 37, a reflective electrode 35 located on the surface of a semiconductor substrate 39, and a layer 31 of electro-optical material sandwiched between the transparent electrode 33 and the reflective electrode 35. The reflective electrode 35 is divided into a two-dimensional array of pixel electrodes that define the pixels of the spatial light modulator 25 and of the light valve 10. A substantially reduced number of pixel electrodes are shown to simplify the drawing. For example, in a light valve for use in a large-screen computer monitor, the reflective electrode 35 could be divided into a two-dimensional array of 1600×1200 pixel electrodes. An exemplary pixel electrode 41 is shown in FIG. 1. Each pixel electrode reflects the portion of the incident polarized light that falls on it towards the beam splitter 19.

A pixel drive circuit applies a pixel drive signal to the pixel electrode of each pixel of the spatial light modulator 25. For example, a pixel drive circuit 44 for an exemplary pixel 42 is shown in this example as being located in the semiconductor substrate 39. The pixel drive signal alternates between two different voltage levels, a high state and a low state. When a liquid crystal material is used as the electro-optical material of the layer 31, the transparent electrode 33 is maintained at a fixed potential mid-way between the voltage levels of the pixel drive signal. The potential difference between the pixel electrode 41 and the transparent electrode 33 establishes an electric field across the part of the layer 31 between the pixel electrode 41 and the transparent electrode 33. The direction of the electric field determines whether the liquid crystal of the layer 31 rotates the direction of polarization of the light reflected by the pixel electrode 41, or leaves the direction of polarization unchanged.

When the display device 11 forms part of a miniature, wearable display, the output optics 23 are composed of an eyepiece that receives the light reflected by the reflective electrode 35 and forms a virtual image at a predetermined distance in front of the viewer (not shown). In a cathode-ray tube replacement or in a projection display, the output optics 23 are composed of projection optics that focus an image of the reflective electrode on a transmissive or reflective screen (not shown). Optical arrangements suitable for use as an eyepiece or projection optics are well known in the art and will not be described here.

Since the direction of maximum transmission of the analyzer 21 is orthogonal to the direction of polarization defined by the polarizer 17, light whose direction of polarization has been rotated through 90° by a pixel of the spatial light modulator 25 will pass through the analyzer 21 and be output from the light valve 10 whereas light whose direction of polarization has not been rotated will not pass through the analyzer 21. The analyzer 21 only transmits to the output optics 23 light whose direction of polarization has been rotated by pixels of the spatial light modulator 25. The direction of the electric field applied to each pixel of the spatial light modulator 25 determines whether the corresponding display pixel will appear bright or dark.

The direction of maximum transmission of the analyzer 21 can alternatively be arranged parallel to that of the polarizer 17, and a non-polarizing beam splitter can be used as the beam splitter 19. In this case, the spatial light modulator 25 operates in the opposite sense to that just described.

Figure 2:
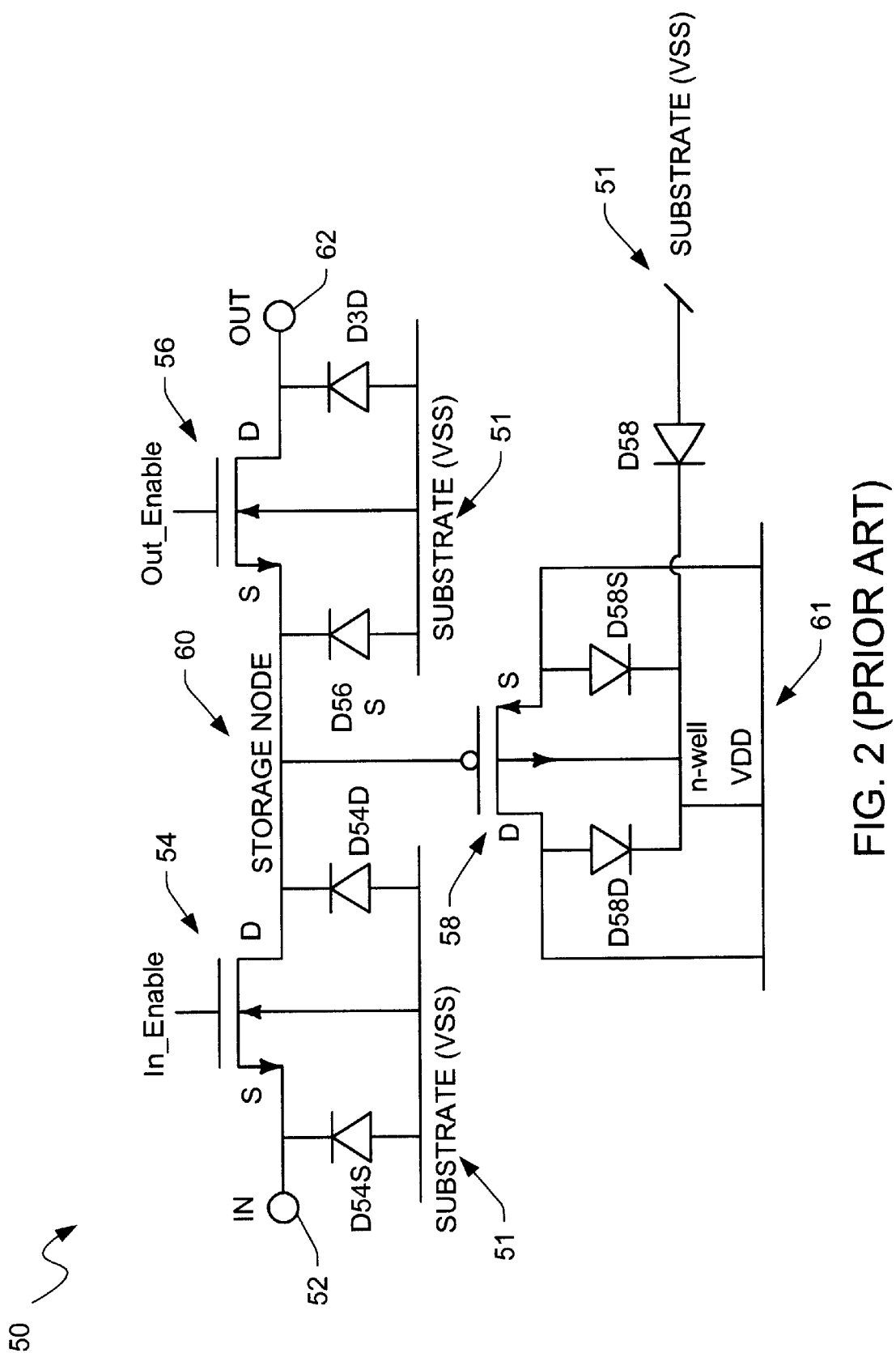
FIG. 2 (PRIOR ART) is a schematic of a storage node circuit of a typical display device.

Referring now to FIG. 2 (PRIOR ART), therein is shown a schematic of a storage node circuit 50 of the typical display device 26 as shown in FIG. 1 (PRIOR ART). The storage node circuit 50 is a part of an integrated circuit (IC) formed on the semiconductor substrate 39 of FIG. 1 and includes an input node 52, an input metal oxide silicon field effect transistor (MOSFET) 54, an output MOSFET 56, a MOSFET 58, a storage node 60, and an output node 62. The input MOSFET 54, the output MOSFET 56, and the MOSFET 58 each have a drain, a source, and a gate. The input MOSFET 54 has its source coupled to the input node 52, its drain coupled to the storage node 60, and its gate coupled to an In_Enable signal. The output MOSFET 56 has its source coupled to the storage node 60, its drain coupled to the output node 62, and its gate coupled to an Out_Enable signal. While the storage node 60 could be directly coupled to a capacitor (not shown), in the present mode, the gate-oxide-substrate portion of the MOSFET 58 forms a capacitive gate portion to store the charge at the storage node 60. The MOSFET 58 has its source and drain commonly connected to the most positive voltage, VDD 61, of the IC.

In this embodiment, an n-well complementary MOS (CMOS) process is used to fabricate the storage node circuit 50. Further, the semiconductor wafer is of a P-type conductivity, the input MOSFET 54 and the output MOSFET 56 are of an N-type conductivity so as to be NMOS devices, and the MOSFET 58 is of a P-type conductivity so as to be a PMOS device.

In normal CMOS operation, the substrate 51 is tied to the most negative voltage, VSS. The n-well is tied to the most positive voltage, VDD 61. In addition, each of the NMOS transistors is isolated from other devices by isolation (parasitic) diodes formed between its source and its drain and the substrate 51. For the input MOSFET 54 and the output MOSFET 56, isolation diodes D54S and D54D are shown respectively coupled between the source of the input MOSFET 54 and the substrate 51, and the drain of the input MOSFET 54 and the substrate 51. Isolation diodes D56S and D56D are shown respectively coupled between the source of the output MOSFET 56 and the substrate 51, and the drain of the output MOSFET 56 and the substrate 51.

Each of the PMOS transistors has its isolation diodes between its source/drain and the n-well, which are shown for the MOSFET 58 as isolation diodes D58S and D58D, respectively. Finally, the n-well is isolated from the substrate through another diode D58. All the isolation diodes D54S, D54D, D56S, D56D, D58S, D58D, and D58 are reverse biased. Proper circuit operation requires that there be negligible current passing through these reverse biased diodes.

The typical display device 26 (shown in FIG. 1) includes a large number, which may be more than a million, small picture elements (not shown). Each one of the picture elements contains a storage node circuit 50 (shown in FIG. 2), which is used to store an analog value at a storage node 60 to be displayed by that picture element.

In use, an analog voltage is coupled to the input node 52 that serves as the input for the picture elements. The analog voltage is then coupled to the source of the input MOSFET 54. When the input MOSFET 54 is on, it will couple the analog voltage on the input node 52 to the storage node 60. The MOSFET 58 is coupled to form a capacitor and is used as a storage element for storing charges (or value) that represent the analog voltage.

After the analog voltage is stored at the storage node 60, the input MOSFET 54 is turned off. In an ideal situation, the charges stored at the storage node 60 would stay there indefinitely until it is time to display the value by coupling it through the output MOSFET 56 to the output node 62. The output node 62 affects display device 11 through a pixel drive circuit, such as the pixel drive circuit 44 of FIG. 1, and the operation of one of the metallic reflective electrodes, such as the pixel electrode 41.

A problem associated with the prior art storage node circuit is that it is difficult to maintain the proper stored value at the storage node 60 when there are photo-induced currents in the IC caused by light falling on the IC. When that happens, hole-electron pairs (free carriers) will be generated in rough proportion to the intensity of the light. Given time, these hole-electron pairs will recombine; however, in lightly doped substrates such as those typically used in display devices, the recombination time can be long enough such that the free carriers are able to move considerable distances. Experiments have shown that these carriers can move up to 500 μm with little difficulty through drift and diffusion. Thus, light falling on a portion of the IC can cause undesired effects in areas far removed from the illuminated section.

Of particular interest are the parasitic diodes D54D and D56S as shown in FIG. 2 (PRIOR ART). These reverse biased diodes serve to isolate the storage node 60 from the substrate so that charges stored at the storage node 60 can be maintained. If a free hole were to migrate near one of these diodes and enter the depletion region, the electric field would pull the free hole towards the substrate and the charge would flow into VSS. Because VSS is a common bias voltage with low-impedance, the effect on circuit operation is minimal. However, if a free electron were to migrate to the depletion regions of the parasitic diodes D54D and D56S, the electric field would sweep the electron into the storage node 60. This would reduce the stored voltage at the storage node 60. If enough free electrons were to migrate to the depletion regions of the parasitic diodes D54D and D56S, the stored voltage at the storage node 60 would be substantially reduced, leading to corrupted data and display errors.

Figure 3:
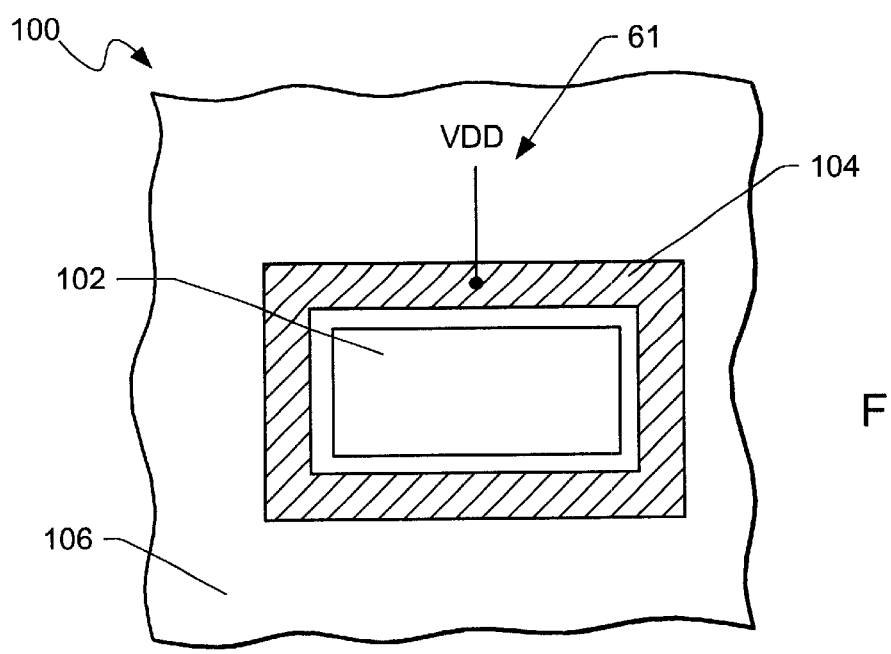
FIG. 3 is a diagram of a storage node circuit with an n-well guard ring.

Referring FIG. 3, therein is shown a portion of an integrated circuit (IC) 100 having a storage node circuit 102 encompassed by an n-well guard ring 104 formed in a semiconductor substrate 106 in accordance with the present invention. Each storage node circuit 102 includes MOSFETs and other elements similar to the storage node circuit 50 as shown in FIG. 2 (PRIOR ART). The n-well guard ring 104 is placed as closely as possible to the MOSFETs and other elements in the storage node circuit 102. The n-well guard ring 104 is coupled to VDD 61 which is the most positive voltage in the IC 100. In this embodiment, the semiconductor substrate 106 is a P-type conductivity silicon substrate.

An n-well is necessary in the process to make a different type of MOSFET, such as the P-type MOSFET, on a P-type silicon substrate. The input and output MOSFETs 54 and 56, respectively, which are used as switches as shown in FIG. 2 (PRIOR ART), are N-type MOSFETs and are formed directly in the P-substrate. The input and output MOSFETs 54 and 56 are isolated from one another by the P-substrate. The MOSFET 58 requires an n-well, as do all other P-type MOSFETs that may be found in the circuit, so no additional processing is required. In the present invention, the n-well guard ring 104 is a region doped with an N-type dopant, which is a Group V element such as phosphorus, and arsenic.

In use, when the n-well guard ring 104 is tied to the most positive voltage, VDD 61, it forms a reverse biased diode (not shown) with respect to the semiconductor substrate 106. This reversed biased diode is capable of collecting photo-induced current (or carriers), similar to the parasitic diodes D54D and D56S of FIG. 2 (PRIOR ART). However, instead of causing the value in the storage node circuit 102 to change, the reverse biased diode between the n-well guard ring 104 and the semiconductor substrate 106 intercepts and captures photo-induced charge that is migrating towards the storage node circuit 102 from outside the n-well guard ring 104 before it reaches the storage node circuit 102. Thus the value stored at the storage node circuit 102 can be maintained.

It should be noted that the combined depth of the n-well guard ring 104 and the associated depletion region of its reversed biased diode extend to a depth of several microns. Since the parasitic diodes connected to the storage node circuit are typically not nearly this deep, the n-well guard ring 104 and the depletion region of its reversed biased diode can very effectively block direct migration of the carriers into the protected node.

Figure 4:
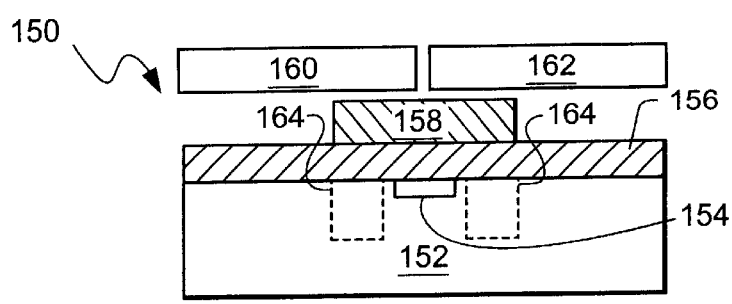
FIG. 4 is a diagram of a storage node circuit with aluminum interconnect shielding layer.

Referring now to FIG. 4, therein is shown a cross section of an IC 150 formed in accordance with the present invention. The IC 150 includes a semiconductor substrate 152, a storage node circuit 154 formed in the semiconductor substrate 152, an insulating layer 156 formed over the semiconductor substrate 152, including the storage node circuit 154, and a shield layer 158 formed on top of the storage node circuit 154.

The shield layer 158 is an opaque layer to block light, which may fall between reflective pixel electrodes 160 and 162. It may also be formed to cover the area encompassed by a guard ring 164 to effectively box in the storage node circuit 154. The shield layer 158 may be formed during the formation of the interconnection layers on the IC so as to require no additional process steps. It may be formed of aluminum, copper, an alloy thereof, a compound thereof, or a combination thereof. In this embodiment, the shield layer 158 is formed of aluminum. The insulating layer 156 may be formed of a conventional semiconductor dielectric material, such as silicon dioxide.

Metallic interconnect layers are present in IC processes for interconnecting transistors and other elements in the circuit. Typically three or four such interconnect layers are available. In a display chip, a metallic layer is used to form a metal reflective electrode to reflect the light from the surface of the chip and form the displayed image.

In use, the shield layer 158 creates a shield against the light and protects the storage node circuit 154 by reflecting light away so that it cannot fall directly on the storage node circuit 154 or areas adjacent to it and produce photo-induced currents. Thus, photo-induced currents are not generated to affect the storage node circuit 154.

It should be noted that there are a number of layers of metallic interconnect layer in a typical IC. It is found that the first metallic layer (the one farthest away from the surface of the underlying semiconductor substrate) provides the most effective shielding over the storage node circuit because light would be least likely to reflect at an angle underneath that first shield layer and reach the storage node circuit below.

Therefore, the present invention provides a method for protecting charge storage elements from photo-induced currents in silicon integrated circuits. By placing an n-well guard ring as closely as possible to the transistors and other elements in the storage node circuits, photo-induced currents that are generated outside the storage node circuits are captured by the n-well guard ring. As a result, the charges stored in the storage node circuit can be maintained. In addition, there is a minimum of exposed silicon area in which light can produce current next to the storage node circuits. By using an interconnect layer, an opaque shield layer on top of the storage node circuit, separated by an insulating layer of silicon dioxide, a shield against the light is formed with no additional processing or cost. The shield protects the storage node circuit by reflecting light away so that photo-induced currents that are generated inside the storage node circuits can be minimized. As a result, the charges stored at the storage node circuit can be maintained.

While the best mode utilizes a NMOS devices for the input and output MOSFETs and a PMOS device for storing charges, it should be understood that equivalent circuits can be fabricated by exchanging NMOS devices for PMOS devices, and vice versa. Likewise, equivalent circuits can be defined in a process that uses P-type wells in an N-type substrate.

While the present invention has been described in conjunction with a specific best mode, it is to be understood that many alternatives, modifications, and variations will be apparent to those skilled in the art in light of the aforegoing description. For example, the present invention is applicable to other circuits that are sensitive to errors caused by current induced by alpha particles or other external means. Accordingly, it is intended to embrace all such alternatives, modifications, and variations which generated within the scope of the included claims. All matters set forth herein or shown in the accompanying drawings are to be interpreted in an illustrative and non-limiting sense.

The invention claimed is:

1. A method of manufacturing an integrated circuit, comprising:

providing a semiconductor substrate;

providing a first voltage line in the semiconductor substrate;

forming a storage node circuit on the semiconductor substrate;

forming a guard ring in the semiconductor substrate, the guard ring positioned close to and encompassing the storage node circuit, the guard ring including a well of a first conductivity type, the guard ring being coupled to the first voltage line for intercepting photo-induced currents;

forming a MOSFET of a first conductivity type coupled to the storage node circuit; and forming an opaque layer over at least a portion above the storage node circuit and the guard ring, the opaque layer cooperating with the guard ring for intercepting photons and photo-induced currents from the storage node.

2. The method of manufacturing an integrated circuit as claimed in claim 1 including:

forming a first MOSFET having a gate, a source, and a drain with the drain coupled to the storage node circuit; and forming a second MOSFET that has a gate, a drain, and a source with the source coupled to the storage node circuit.

3. The method of manufacturing an integrated circuit as claimed in claim 1 wherein:

forming the storage node circuit includes forming a capacitor.

4. The method of manufacturing an integrated circuit as claimed in claim 3 wherein:

forming the storage node circuit includes forming a MOSFET of a second conductivity type, the MOSFET including a capacitive gate portion, and where the MOSFET is also coupled to the guard ring.

5. The method of manufacturing an integrated circuit as claimed in claim 1 including:

forming an insulating layer over the semiconductor substrate and the storage node circuit; and forming the opaque layer over the insulating layer, the opaque layer having at least a portion above the storage node circuit and the guard ring.

6. The method of manufacturing an integrated circuit as claimed in claim 5 including:

forming a plurality of semiconductor devices on the semiconductor substrate;

forming a plurality of conductive interconnect layers over the insulating layer, the conductive interconnect layers connecting the plurality of semiconductor devices; and wherein:

forming the plurality of conductive interconnect layers forms the opaque layer.

* * * * *